US006292374B1

(12) United States Patent
Johnson et al.

(10) Patent No.: US 6,292,374 B1
(45) Date of Patent: Sep. 18, 2001

(54) ASSEMBLY HAVING A BACK PLATE WITH INSERTS

(75) Inventors: Michael Gunnar Johnson, Sparta; Janusz B. Sosnowski, Rockaway, both of NJ (US)

(73) Assignee: Lucent Technologies, Inc., Murray Hill, NJ (US)

( * ) Notice: Subject to any disclaimer, the term of this patent is extended or adjusted under 35 U.S.C. 154(b) by 0 days.

(21) Appl. No.: 09/087,098

(22) Filed: May 29, 1998

(51) Int. Cl.$^7$ ............................. H05K 7/02; H05K 7/04; H05K 7/20

(52) U.S. Cl. .................... 361/808; 361/718; 361/719; 361/720; 361/761; 361/764; 361/809; 174/252; 174/260; 257/707; 257/711; 257/728

(58) Field of Search .................. 361/719, 717, 361/718, 720, 722, 761–764, 807–809; 257/711, 706, 707, 728; 174/252, 260

(56) References Cited

U.S. PATENT DOCUMENTS

| 3,417,294 | * | 12/1968 | Steidlitz | 361/762 |
|---|---|---|---|---|
| 3,648,114 | * | 3/1972 | Manuali et al. | 361/762 |
| 3,786,375 | * | 1/1974 | Sato et al. | 361/762 |
| 3,982,271 | * | 9/1976 | Olivieri et al. | 257/719 |
| 4,030,001 | * | 6/1977 | Medley, Jr. et al. | 361/761 |
| 4,538,124 | * | 8/1985 | Morrison | 361/722 |
| 5,012,386 | * | 4/1991 | McShane et al. | 361/715 |
| 5,641,944 | | 6/1997 | Wieloch et al. | 174/252 |
| 5,646,444 | | 7/1997 | Bartlett et al. | 257/706 |
| 5,652,696 | * | 7/1997 | Traylor et al. | 361/764 |
| 5,819,398 | * | 10/1998 | Wakefield | 361/719 |
| 5,825,625 | * | 10/1998 | Esterberg et al. | 361/719 |

FOREIGN PATENT DOCUMENTS

| 19532922 A1 | 3/1997 | (DE) | H05K/7/20 |
|---|---|---|---|
| 19601649 A1 | 7/1997 | (DE) | H05K/7/20 |
| 0 085 622 A2 | 8/1983 | (EP) | H01L/23/36 |
| 2 639 764 | 6/1990 | (FR) | H01L/23/367 |
| 1 262 858 | 3/1968 | (GB) | H05K/3/30 |
| 61214453 | 9/1986 | (JP) | H01L/23/36 |
| 01312889 | 12/1989 | (JP) | H05K/1/18 |
| WO 92/22090 | 12/1992 | (WO) | H01L/23/48 |
| WO 98/18302 | 4/1998 | (WO) | H05K/7/20 |

OTHER PUBLICATIONS

"High Efficiency, Through Card Thermal Enhancement", *IBM Technical Disclosure Bulletin*, vol. 34 No. 10A, Mar. 1992, pp. 150–157.

* cited by examiner

*Primary Examiner*—Jeffrey Gaffin
*Assistant Examiner*—John B. Vigushin
(74) *Attorney, Agent, or Firm*—Irene Lager (57) ABSTRACT

An assembly that has an insert that fits onto a back plate. The back plate receives a circuit board that covers at least a portion of the insert. A components attaches to the circuit board and to the insert. The insert is made out of a material having a thermal expansion coefficient that is close to the thermal expansion coefficient of the bottom surface of the component, which allows the component to be securely soldered to the insert and therefore to the assembly. Preferably the insert is also made out of a good conductor to provide a good electrical conduction path between the component and the ground plane of the circuit board that contact the insert. The insert either fits into a recessed area in the back plate or attaches to the top of the back plate. In an alternative embodiment, the assembly has a circuit board with a contact opening and a back plate with a raised area that fits into the contact opening. The contact opening exposes a portion of ground plane on the circuit board. The raised area contacts this portion of the ground and thereby makes a large and low impedance connection with the ground. Preferably the raised area is created by the insert. Using inserts to create the raised areas allows the back plate to have raised areas, yet to be machined without raised areas, thus preventing the warping of the back plate created when the back plate is machined with raised area.

35 Claims, 6 Drawing Sheets

ASSEMBLY HAVING A BACK PLATE WITH INSERTS

BACKGROUND OF THE INVENTION

1. Field of the Invention

This invention is related to assemblies, and more particularly to assemblies that have a back plate that can be attached to a circuit board.

2. Description of the Related Art

Figure 1:
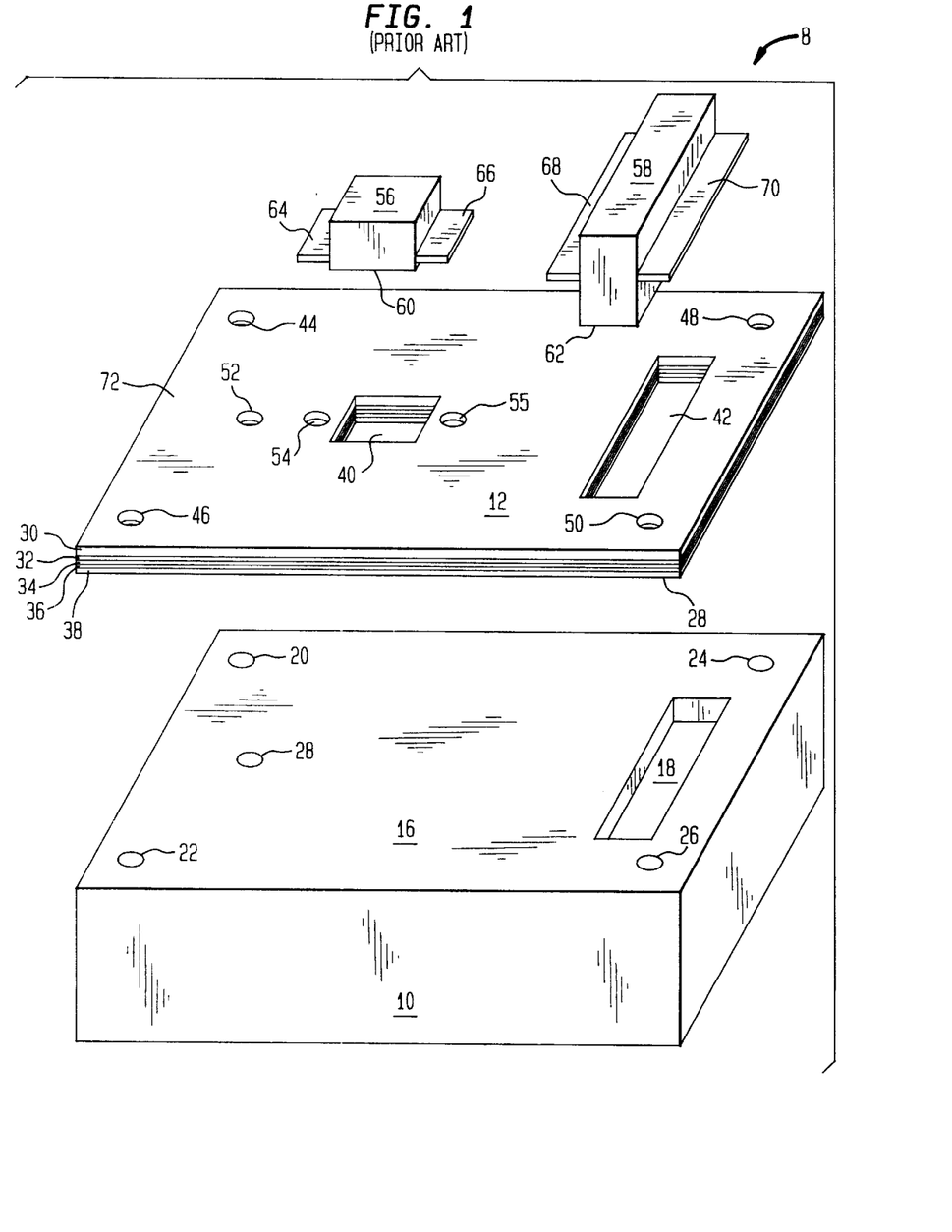
FIG. 1 is an exploded view of a prior art assembly having a conventional back plate, a circuit board, and components.

In many applications it is advantageous to attach a back plate to a circuit board. FIG. 1 is an exploded view of circuit board assembly 8. Assembly 8 has back plate 10 that attaches to circuit board 12. Back plate 10 has a plurality of openings. Some of the openings, such as opening 18, go through a portion of back plate 10 to accommodate components. Other openings, such as openings 20, 22, 24, 26, 28, run through the entire back plate 10, and are typically for fasteners. The fasteners can be used to fasten back plate 10 to circuit board 12 and to the equipment or device that receives assembly 8. Back plate 10 is typically fabricated out of metal and is preferably thick enough to be rigid.

Typically, back plate 10 is fabricated out of inexpensive lightweight metal, such as aluminum. The length, width, and thickness of back plate 10 are large enough to receive circuit board 12 and keep the circuit board fairly rigid when it is attached to the back plate. The length and width of back plate 10 are typically about the same as the length and width of circuit board 12. Top side 16 of back 10 plate fits on one side 28 of circuit board 12. Circuit board 12 is thin, and therefore difficult to work with because it bends and warps. The additional thickness provided when circuit board 12 is attached to back plate 10 makes circuit board 12 fairly rigid, preventing circuit board 12 from bending or warping. It is much more accurate and economical to install components with automatic surface mount equipment. It easier to install components onto circuit board 12 when it is rigid because if the circuit board surface is warped the circuit board may not be able to go through the automatic surface mount equipment due to its shape, and when it can go through the equipment, it is difficult to deposit components in the right locations due the circuit board continuing to bend as component are deposited. It is also easier to install circuit board 12 into equipment when it does not bend or warp since it is easier to machine flat surfaces to receive circuit board 12 in the equipment than to machine surfaces that can receive a warped or bent circuit board.

Circuit board 12 has one or more layers 30, 32, 34, 36, 38. Some of layers, such as layers 30, 34, 38 have a conductor, such as copper, deposited on one or on both sides to form a particular pattern of tracks that is the printed wiring. These layers 30, 34, 38 are formed out of plastic or out of a plastic and glass compound. Other layers, such as layers 32, 36 are formed of an epoxy material and hold the layers of circuit board 12 together. Tracks are used to provide a power grid, a ground grid, and other electrical connection for components 56, 58. For example, in circuit board 12 designed for both digital components 58 and RF components 56: layer 34 has tracks that are the connections for digital component 58 on the top side of layer 34, and tracks that are the digital ground on the bottom side of layer 34. Circuit board 12 also has layer 30 with tracks that are the connections for RF components 56 on the top side of layer 30, and tracks that serve as RF ground on the bottom side of layer 30. Circuit board 12 has openings 44, 46 48, 50, 52 that run through all of the layers. These openings are for the fasteners that connect circuit board 12 and back plate 10.

Circuit board 12 designed to work with RF component 56 has connect openings 54, 55 located near the location of the RF components. Connect openings 54, 55 are through layer 30 that has the tracks are the RF ground. There is a connection through connect openings 54, 55 between RF component 56 are the RF ground, this connection provides an electrical conduction path between RF component 56 and the RF ground.

Circuit board 12 has component openings 40, 42 through the entire depth of circuit board 12. Components 56, 58 fit through component openings 40, 42, respectively. A thin metal layer, hereinafter flange 60, 62, at the bottom of components 56, 58, contacts back plate 10. Components 56, 58 are either integrated circuits or discrete devices connected to circuit board 12 by leads 64, 66, and 68, 70, respectively. Leads 64, 66, 68, 70 are attached to the printed wiring on top surface 72 of circuit board 12.

As described above, typically back plate 10 is fabricated out of inexpensive lightweight metal, such as aluminum. One problem with fabricating back plate 10 out of aluminum is that the thermal expansion coefficient of aluminum is very different from the thermal expansion coefficient of the metal that forms flanges 60, 62. This makes it difficult to solder components 56, 58 to back plate 10. The temperature of flanges 60, 62 and back plate 10 are raised during the soldering process. As flanges 60, 62 and back plate 10 cool after they are soldered together, flanges 60, 62 contract at a different rate than back plate 10, thus pulling apart the solder and breaking the connection. This can cause components 56, 58 to break away from the rest of assembly 8.

Fabricating back plate 10 out of a material such as a copper, that has a thermal expansion coefficient that is close to the thermal expansion coefficient of flanges 60, 62 creates a different problem. Since back plate 10 should be large enough to support circuit board 12 and to provide a good thermal conduction path away from circuit board 12. Fabricating a large back plate from a metal that is a good conductor would tremendously increase the cost of the assembly, going against the long term industry goals and trends of reducing cost. Furthermore, because copper is a heavy material, a large copper back plate would make the assembly heavy and therefore more difficult to support. Additionally, the current trend is to combine more and more components on a single circuit board, requiring larger circuit boards and therefore larger back plates, which further increases the cost and weight of the back plate.

Another problem with assembly 8 is that the electrical connection between RF component 56 and the RF ground is through connect openings 54, 55. The size of connect openings 54, 55 is restricted by the area that can be apportioned on leads 64, 66. Typically, connect openings 54, 55 are small. Because connect openings 54, 55 are small it is difficult to ensure that a good connection is made between component 56 and ground.

SUMMARY OF THE INVENTION

The invention solves the above problems by providing an assembly that has an insert that fits onto the back plate. The insert either fits into a recessed area in the back plate or attaches to the top of the back plate. When the insert fits into the recessed area the insert is either about the same height as the depth of the recessed area, or its height is larger than the depth of the recessed area, to create a raised area on the back plate. A component can be attached to the assembly. The bottom surface of the component is attached to the top surface of the insert. The insert is made out of a material having a thermal expansion coefficient similar to the thermal expansion coefficient of the bottom surface of the component. This allows the component to be securely soldered to the insert and therefore to the assembly. Preferably the insert is also made out of a good conductor to provide a good electrical conduction path between the component and the ground plane of the circuit board that contacts the insert.

In an alternate embodiment the assembly has a circuit board having a contact opening and a back plate with a raised area that fits into the contact opening. The contact opening exposes a portion of the ground plane on the circuit board. The raised area contacts this portion of the ground and thereby makes a secure connection with the ground. Preferably, the raised area is an insert that is either placed into a recessed area on the back plate or attached to the top of the back plate. Using inserts to create the raised areas allows the back plate to have raised areas, yet to be machined without raised areas. This prevents the warping of the back plate created when the back plate is machined with raised area. The insert can be made out of the same material as the back plate, or out of a good conductor that has a thermal expansion coefficient close to that of the bottom surface of the component. The insert made out of a good thermal conductor allows components to be securely soldered to the assembly. The insert made out of a good conductor creates a better conduction path between the components and the ground track in contact with the insert.

BRIEF DESCRIPTION OF THE DRAWINGS

It should be noted that the figures are drawn to best illustrate preferred embodiments of the invention and are not drawn to scale.

DETAILED DESCRIPTION

Figure 2A:
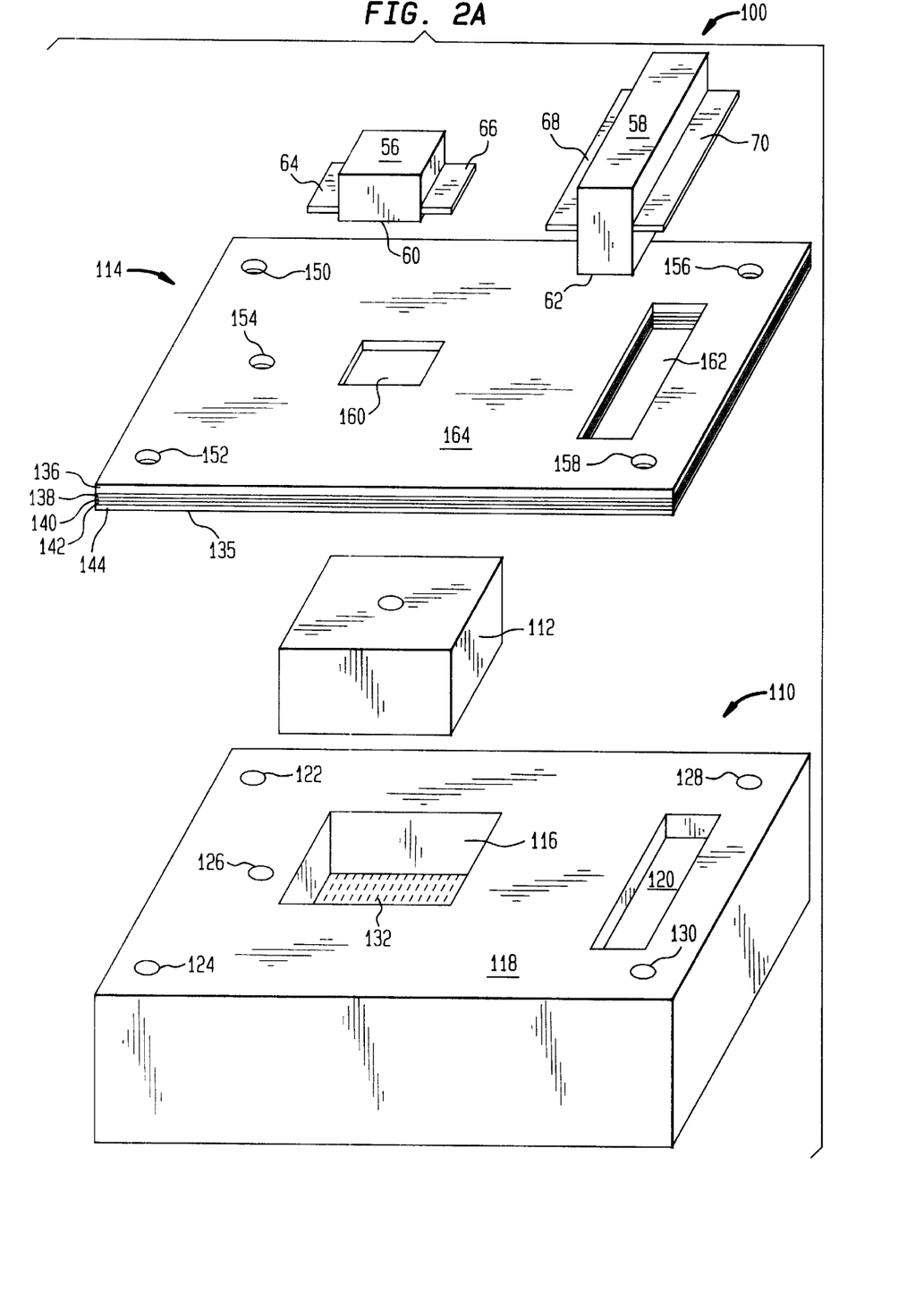
FIG. 2a is an exploded view of an assembly having a back plate with inserts, a circuit board, and components.

Referring to FIG. 2a, an assembly according to an embodiment of the present invention is generally designated by reference numeral 100. Assembly 100 includes back plate 110, insert 112, circuit board 114, and components 56, 58. Insert 112 contacts back plate 110. Circuit board 114 attaches to back plate 110 such that a portion of circuit board 114 covers at least a portion of insert 112. Components 56, 58 are coupled to both circuit board 114 and back plate 110.

Back plate 110 is made out of aluminum, but can be made out of any material that balances the desire to keep back plate 1 10 light and inexpensive, yet as highly thermally conductive as possible. Back plate 110 is thick enough to be rigid. Preferably, the length and width of back plate 110 are about the same as that of circuit board 114, although back plate 110 can be larger or smaller than circuit board 114. The length, width, and thickness of back plate 110 should be large enough to keep circuit board 114 fairly rigid so that it does not bend, warp, or move. Keeping circuit board 114 fairly rigid makes circuit board 114 easier to work with as components 56, 58 are attached to assembly 100 and as circuit board 114 is installed in equipment or a device that receives assembly 100.

Back plate 110 has recessed area 116 in top surface 118. Typically, recessed area 116 is a cavity machined into back plate 110. Back plate 110 can also have other openings 120, 122, 124, 126, 128, 130. Some of the openings, such as opening 120, are to accommodate components. Other openings, such as openings 122, 124, 126, 128, 130, run through back plate 110, and are used for fasteners that attach back plate 110 to circuit board 114 and fasten assembly 100 to the equipment or device that receives assembly 100.

Insert 112 fits into recessed area 116. Optionally, thermally and/or electrically conductive grease or pad 132 is placed between insert 112 and the top surface of recessed area 116 to minimize thermal resistance between insert 112 and back plate 110. Recessed area 116 has approximately the same length and width as insert 112, so insert 112 easily fits into recessed area 116. Insert 112 attaches to back plate 110 by a fastener, preferably a screw, although any conventional fastener, such as a rivet, or adhesive material, can be used. The fastener is recessed such that no portion of the fastener protrudes above the top surface of insert 112. Alternatively, insert 112 can be placed into recessed area 116 and held in place by the shape of recessed area 116 and the shape of circuit board 114, which is positioned over insert 112 and attached to back plate 110. Bottom surface 135 of circuit board 114 faces top surface 118 of back plate 110.

Figure 2B:
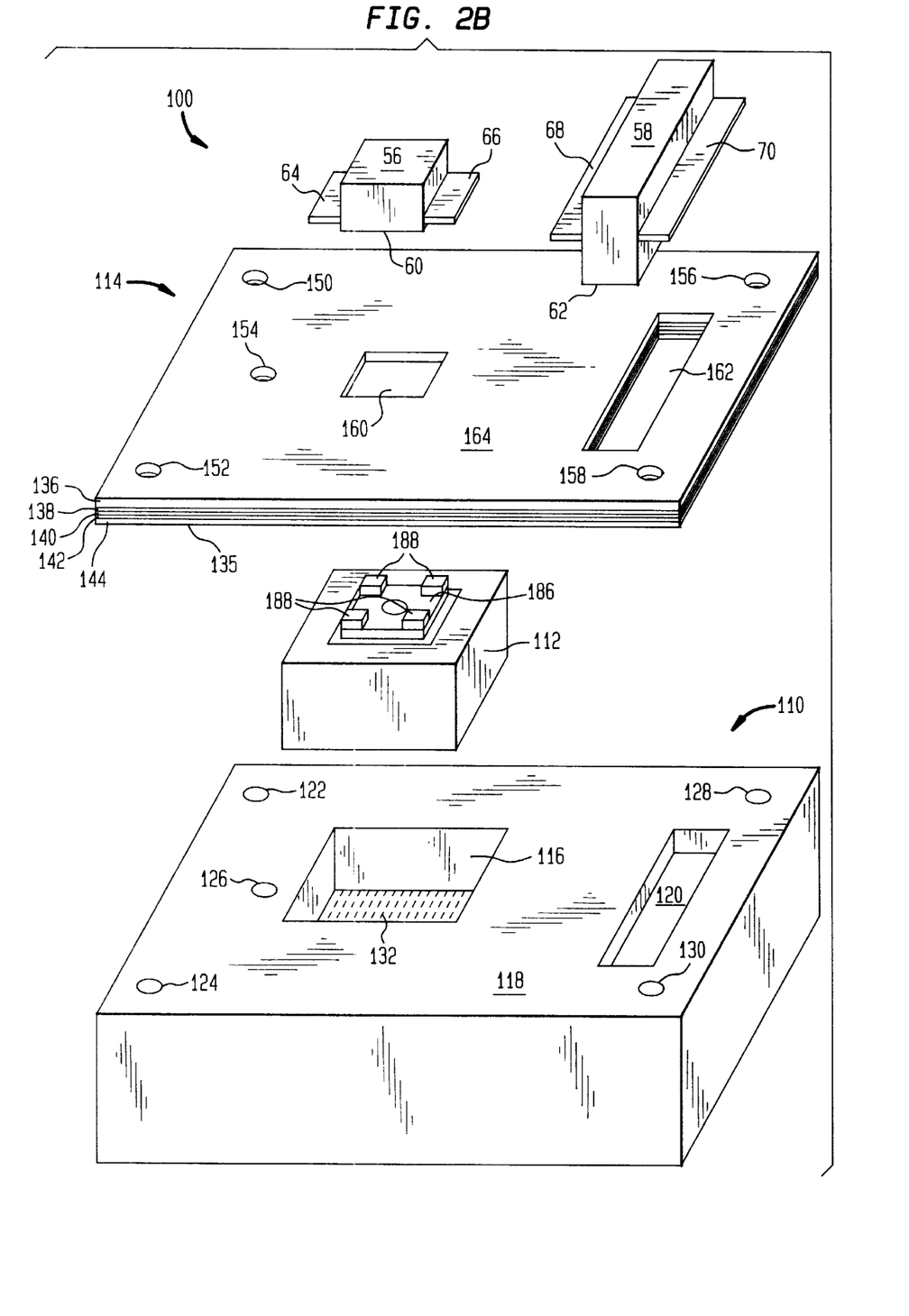
FIG. 2b is an exploded view of another assembly having a back plate with inserts, a circuit board, and components.
Figure 3:
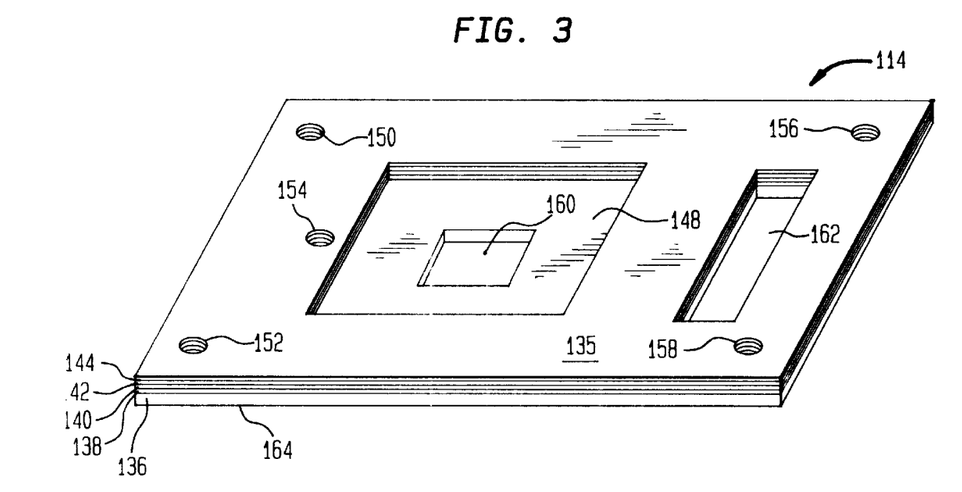
FIG. 3 is a perspective view of the circuit board in FIGS. 2a and 2b from the side that contacts the back plate.

In the preferred embodiment, circuit board 114 is a multi-layer circuit board 114 that can support both RF components 56 and digital components 58. Referring to FIGS. 2 and 3 concurrently, circuit board 114 is made out of a plurality of layers 136, 138, 140, 142, 144. Some of the layers 136, 140, 144 have a conductor, such as copper, deposited on either one or on both sides to form a particular pattern of tracks that is the printed wiring. These layers 136, 140, 144 are made out of plastic or out of a plastic and glass compound. Other layers 138, 142 are made of an epoxy material and hold the layers of circuit board 114 together. Layer 144 has tracks that serve as a power grid on one side, and tracks that serve as a power ground grid on the other. Layer 140 has tracks that serve as connections for the digital components 58 on one side, and tracks that serves as the digital ground on the other side. Layer 136 contains tracks that serve as connections for the RF components 56 on one side, and tracks that serve as RF ground on the other side. Circuit board 114 has contact opening 148 through several layers that exposes a portion of the RF ground plane on layer 136. Contact opening 148 is near the location of the RF component. Other openings 150, 152, 154, 156, 158, positioned over the openings 122, 124, 126, 128, 130, in back plate 110 run through the entire depth of circuit board 114 and are used for fasteners that fasten circuit board 114 to back plate 110. Circuit board 114 also has component openings 160, 162 that go through the entire depth of circuit board 114.

Components 56, 58 fit through component openings 160, 162. Components 56, 58 are either integrated circuits or discrete devices that are connected to circuit board 114 through leads 64, 66, and 68, 70, respectively. Leads 64, 66, and 68, 70 connect to the printed wiring on top surface 164 of circuit board 114.

RF component 56 is connected to insert 112. There is a thermal and an electrical connection between RF component 56 and back plate 110 through insert 112.

Figure 4A:
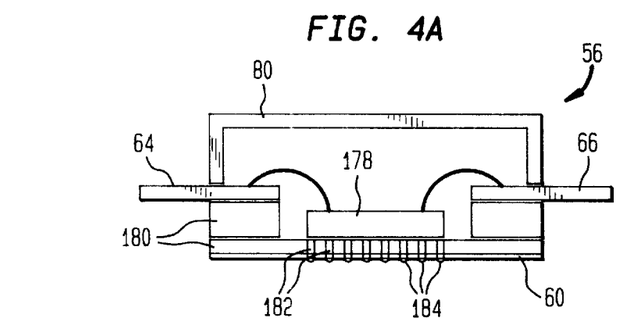
FIG. 4a is a cross-section of a component.
Figure 4B:
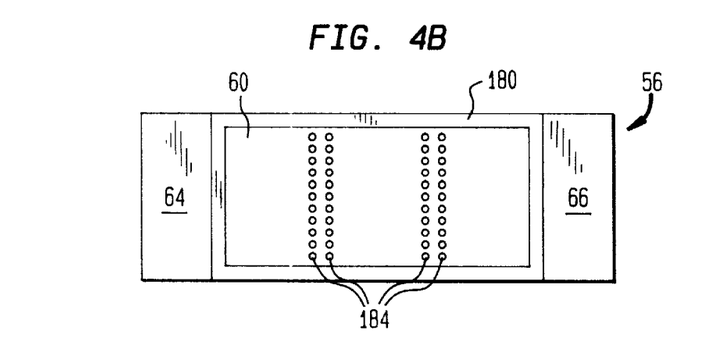
FIG. 4b is a bottom view of a component.

Referring to FIG. 4a, component 56 is typically, one, or a plurality of semiconductor devices or integrated circuits 178 housed in a plastic or ceramic package 180. There is a thin conductive layer on the bottom of package 180 referred to as flange 60. Flange 60 is electrically coupled to the bottom of device or IC 178, typically through metal contacts 182 that run through the bottom of package 180. In some applications, flange 60 has small solder bumps 184, as shown in FIG. 4b, to attach flange 60, and therefore component 56, 58, to insert 112 or to back plate 110.

Referring again to FIG. 2a, preferably, insert 112 is fabricated out of a material that has a thermal expansion coefficient close to the thermal expansion coefficient of flange 60. A material whose thermal expansion coefficient is anywhere within about 15 ppm/° C., hereinafter thermal expansion coefficient range, from the thermal expansion coefficient of flange 60 can be used. For example, a copper insert, which has a thermal expansion coefficient of 17 ppm/° C., can be used with a typical flange 60 that has a thermal expansion coefficient of 4 ppm/° C. to 6.5 ppm/° C. when flange 60 is 6 millimeters. When insert 112 has an expansion coefficient within the thermal expansion coefficient range of flange 60, insert 112 can expand and contract at a similar rate as flange 60 when the two are heated and cooled. This permits insert 112 to be soldered to flange 60. This solder joint remains secure when insert 112 and flange 60 cool. Flange 60 grounds component 56 and assists with heat dissipation from component 56. Component 56 fits through contact opening 160 such that flange 60 contacts the top surface of insert 112. Flange 60 is preferably attached to insert 112 with solder, although a material that minimizes thermal and electrical resistance, such as a thermally and electrically conductive grease or pad, can be used to connect insert 112 to flange 60.

Figure 5:
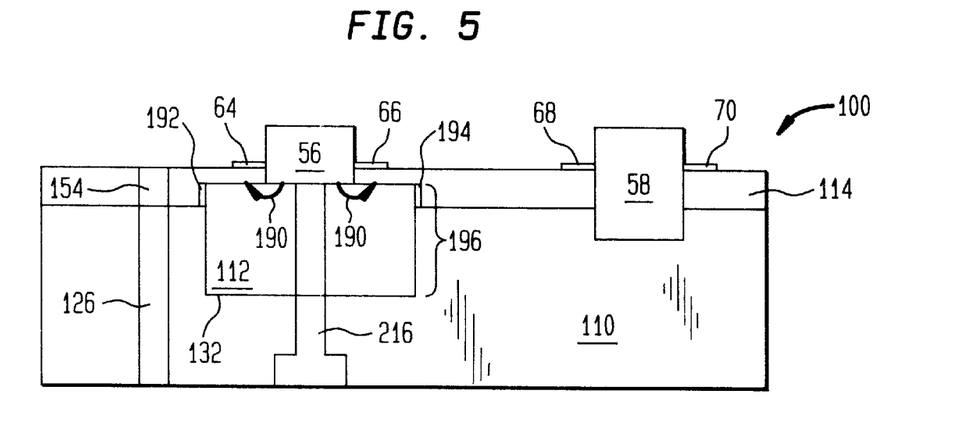
FIG. 5 is a cross-sectional view of an assembly having a circuit board having a contact opening, and a back plate with an insert having a height larger than the depth of a recessed area of the back plate.

In the preferred embodiment, insert 112 is made out of a good thermal and electrical conductor, such as copper, aluminum silicon carbide, or most preferably a metal-matrix composite such as copper tungsten, although insert 112 could be made out any material including the same material as back plate 110. Insert 112 fits into contact opening 148 connecting to the RF ground. Referring to FIG. 5, insert 112, fabricated out of a good electrical conductor, provides a good conduction path 190 from component 56 to the RF ground.

Referring to FIG. 2b, insert 112 can have another raised area 186 that fits into components opening 160. The height of this raised area should be large enough to compensate for any variation on the position of leads 64, 66 from the bottom of component 56. If leads 64, 66 are too close to the bottom of component 56, raised area 186 prevents leads 64, 66 from squashing out the solder that is used to create a solder joint between leads 64, 65, and circuit board 114. Additionally, the insert can have bumps 188 on the edges of the surface where component 56 connects to insert 112. The solder that forms the solder joint between insert 112 and component 56 is deposited in the area between bumps 188. When component 56 is attached, component 56 contacts insert 112. Component 56 stops on bumps 188 and does not squish out the solder. Bumps 188 are located on raised area 186 when raised area 186 is present on insert 112. Insert 112 can be plated with a metal, such as gold. When raised area 186 is present, the plating on raised area 186 should be isolated from the plating on the rest of insert 112 to prevent solder from leaking over the rest of insert 112. This can be accomplished with a well around raised area 186.

Referring to FIGS. 2, 3, and 5 concurrently, the length and width of contact opening 148 is approximately the length and width of insert 112 plus two tolerances lengths. Each tolerance length is large enough to leave room for epoxy that squeezes out from epoxy layers 138, 142 of circuit board 114 when circuit board 114 is fabricated. This leaves gaps 192, 194 of up to one tolerance on each side of insert 112. The length and width of insert 112 is a compromise between making the weight and cost of the insert as small as possible, and making the insert as large as possible without interfering with neighboring circuitry. If the insert is too large it will contact the neighboring circuitry on circuit board 114. This may produce an undesired conduction path between component 56 and neighboring circuitry, which can lead to interference or even to a short.

Height 196 of insert 112 can be larger than the depth of recessed area 116, such that a portion of insert 112 protrudes over the top surface of back plate 110. Height 196 of insert 112 is approximately equal to the depth of contact opening 148 plus the depth of the recessed area 116. In this case, because insert 112 creates a raised area on back plate 110, placing insert 112 into back plate 110 is advantageous whether the insert is made of the same material as back plate 110 or made out of a good thermal and electrical conductor. The raised area provides a large contact area with the RF ground layer through contact opening 148 and therefore provides an electrical path between the component and the RF ground. The insert is a particularly advantageous in creating the raised area without having to machine a raised area on the back plate. This is important because machining a raised area on the back plate often warps the back plate. Additionally, when the insert is made out of a good thermal conductor, it places a good heat sink in thermal contact with component 56.

Although the assembly has been described as having a back plate, insert, circuit board and components, the assembly can include fewer elements. For example, the assembly can include the back plate and the insert, or the back plate the insert and the circuit board. Furthermore, although contact opening 148 goes through all of layers 138, 140, 142, 144 between the RF ground and the bottom of circuit board 114, the contact opening can go through layers 142, 144 between the digital ground layer 140 and the bottom of the circuit board to provide a large contact between the insert and the digital ground. Since digital component 58 attaches to the insert, this provides a large area where there is a connection between digital component 58 and the digital ground.

Figure 6:
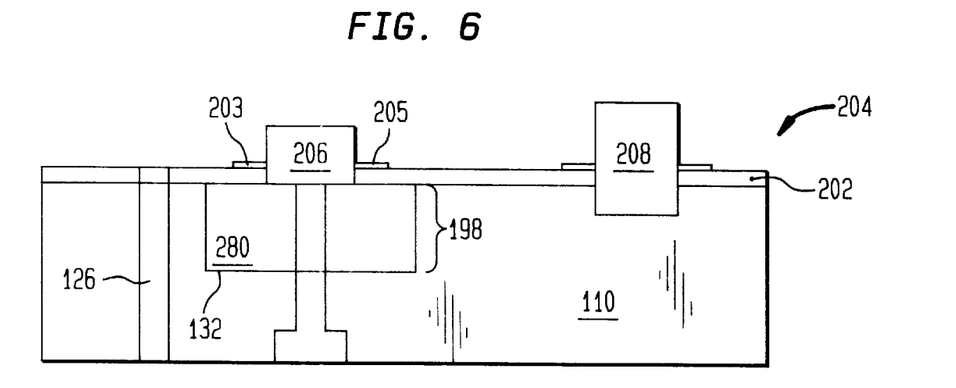
FIG. 6 is a cross-sectional view of an assembly having a back plate with inserts having a height smaller or equal to the depth of a recessed area of the back plate, a circuit board, and a component.

In an alternate embodiment of the invention, shown in FIG. 6, height 198 of insert 200 is approximately equal to the depth of recessed area 116, such that insert 200 fits entirely into recessed area 116. Height 198 of insert should be approximately the same as the depth of the recessed area for the top surface of the insert to be approximately level with the top surface of the back plate. Insert 200 can be just the metal insert or it can include any material placed above or below insert 200, such as the thermally conductive grease or pad. Insert 200 that does not protrude over the top surface of back plate 110 contacts the bottom layer of circuit board 202. Circuit board 202 can be a single-layer, as shown, or a multi-layer circuit board. Insert 200 contacts the tracks on the bottom layer of circuit board 200. These tracks on the bottom of the bottom layer of the circuit board usually are ground. Since insert 200 contacts these tracks, it provides a good connection between component 206, typically a digital component, and ground.

Figure 7:
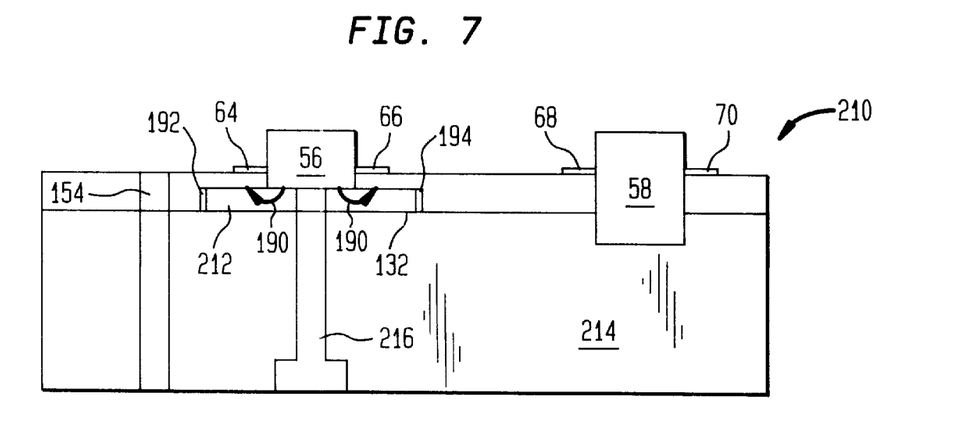
FIG. 7 is a cross-sectional view of another assembly having a back plate with inserts, a circuit board, and components.

In yet another alternate embodiment of the invention, shown in FIG. 7, assembly 210 has insert 212 attached to the top surface of back plate 214 without being inserted into a recessed area. Back plate 214 is similar to the back plate described above, except there is no recessed area in the location where insert 212 is attached. Optionally, thermally and/or electrically conductive grease or pad 132 can be placed between insert 212 and the top surface of back plate 214, or between insert 212 and component 56. The length, width, and material that comprise insert 212 are the same as that of the inserts described in the above embodiments.

Insert 212 attaches to back plate 214 by a fastener, preferably screw 216, although any conventional fastener, such as a rivet, or adhesive material, can be used. Fastener 216 should be recessed such that no portion of fastener 216 protrudes above the top surface of insert 212. The height of insert 212 is the depth of contact opening 148. Referring to FIGS. 2 and 7 concurrently, the height of insert 112 is the depth of contact opening 148 plus the depth of recessed area 116. Therefore, the height of insert 212 is smaller than the height of insert 112 for the same size contact opening 148. A shorter insert 212 makes it more difficult to ensure that the fastener is recessed in insert 212.

Attaching insert 212 to the back plate places a good electrical conductor between the component and ground, while not significantly increasing the cost of assembly 210. Assembly 210 not having a recessed area is easier to manufacture than assembly 100 with recessed areas 116. Like the assemblies described above, although assembly 210 has been described as containing the back plate, the insert, the circuit board, and the component, the assembly can contain fewer elements. For example, the assembly can contain the back plate and the insert, or the assembly can contain the back plate, the insert, and the circuit board.

Figure 8:
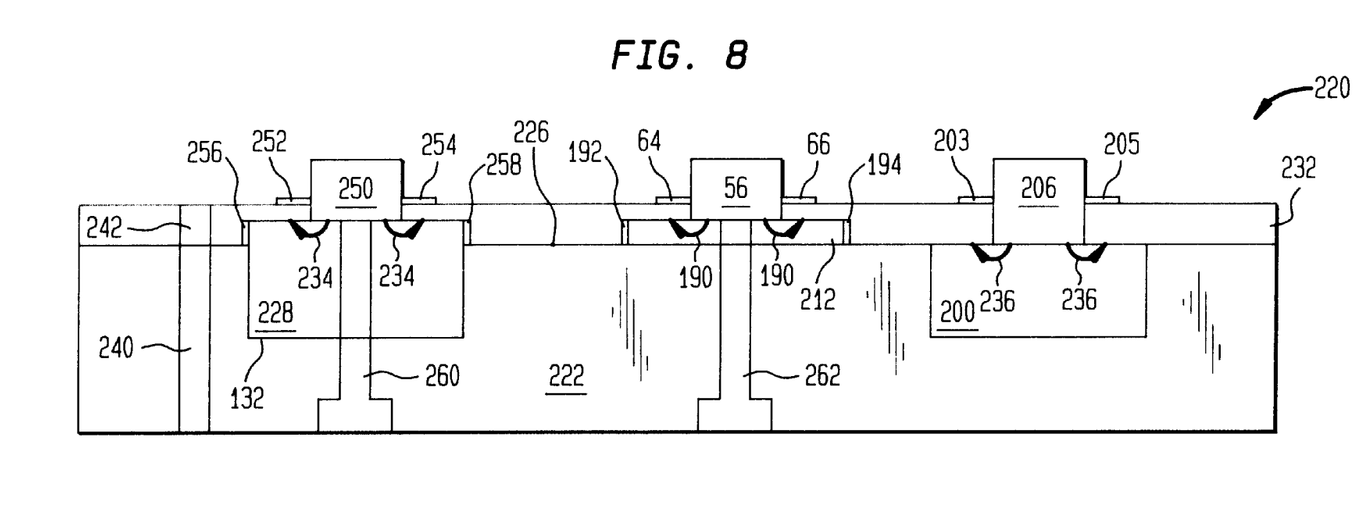
FIG. 8 is a cross-sectional view of another assembly having a back plate with inserts, a circuit board, and components.

Although the invention has been described with just one insert, one skilled in the art will understand that the assembly can have a plurality of inserts. The inserts can be in accordance with any of the embodiments described above, or any combinations of these embodiments. For example, the assembly can include a plurality of recessed areas each having an insert made out of a good conductor on an aluminum back plate, with each insert protruding over the top surface of the back plate and fitting into an opening in the circuit board. In another example, shown in FIG. 8, assembly 220 can have: insert 212 made out of a good conductor attached to back plate 222; insert 200 made out of a good conductor fitting into recessed area 224 on back plate 222 but not protruding over top surface 226 of back plate 222; and insert 228 made out of the same material as back plate 222 protruding over the top surface of back plate 222 and fitting into opening 230 in circuit board 232.

While the invention has been described with reference to a preferred embodiment, it will be understood by those skilled in the art having reference to the specification and drawings that various modifications may be made and various alternatives are possible therein without departing from the spirit and scope of the invention.

We claim:

1. An assembly comprising:
   a back plate adapted for receiving a circuit board; and
   an insert coupled to the back plate, the insert adapted for electrically coupling to an electronic component having a flange having a thermal expansion coefficient;
   the insert comprising a material having a thermal expansion coefficient within a thermal expansion coefficient range from the thermal expansion coefficient of the flange.

2. The assembly of claim 1, wherein:
   the back plate has a recessed area with a depth; and
   the insert is positioned in the recessed area, the insert having a height at least equal to the depth of the recessed area.

3. The assembly of claim 2, wherein the insert has a height larger than the depth of the recessed area.

4. The assembly of claim 1, wherein:
   the back plate comprises a first material; and
   the insert comprises a second material.

5. The assembly of claim 4, wherein the second material comprises a metal-matrix composite alloy.

6. The assembly of claim 1, wherein:
   the circuit board is coupled to the back plate, the circuit board covering at least a portion of the insert;
   the electronic component is coupled to the circuit board and electrically coupled to the insert; and
   the insert is attached to the electronic component by solder.

7. The assembly of claim 6, wherein:
   the circuit board has a component opening in a portion of the circuit board which covers the portion of the insert; and
   the insert includes a raised area that fits into the component opening.

8. The assembly of claim 6, wherein:
   the circuit board has a contact opening such that at least a part of the insert is positioned in the contact opening;
   the circuit board has a plurality of layers;
   the contact opening exposes at least a portion of a ground plane on one of the layers of the circuit board; and
   the insert is electrically coupled to the exposed ground plane.

9. The assembly of claim 8, wherein the ground plane serves as an RF ground.

10. The assembly of claim 1, wherein the insert comprises a first insert material and a second insert material.

11. The assembly of claim 10, wherein:
    the first insert material comprises a metal-matrix composite; and
    the second insert material comprises a thermally and electrically conductive grease.

12. The assembly of claim 1, wherein:
    the back plate has a top surface; and
    the insert is positioned on the top surface of the back plate such that a portion of the insert protrudes above the top surface.

13. The assembly of claim 1, wherein the insert is coupled to the back plate by a fastener.

14. The assembly of claim 13, wherein the fastener is a screw.

15. The assembly of claim 1, wherein the thermal expansion coefficient range comprises about 15 ppm/° C.

16. An assembly comprising:
a back plate, the back plate comprising a first material;
an insert coupled to the back plate, the insert comprising a second material;
a circuit board coupled to the back plate such that at least a portion of the circuit board covers at least a portion of the insert; and
an electronic component coupled to the circuit board and electrically coupled to the insert, the electronic component having a flange having a thermal expansion coefficient;
the second material having a thermal expansion coefficient within a thermal expansion coefficient range from the thermal expansion coefficient of the flange.

17. The assembly of claim 16, wherein:
the electronic component is a radio frequency (RF) component;
the circuit board has at least one layer having a RF ground plane; and
the insert is electrically coupled to the RF ground plane.

18. The assembly of claim 16, wherein:
the circuit board has a component opening in a portion of the circuit board which covers the portion of the insert; and
the insert includes a raised area that fits into the component opening.

19. The assembly of claim 16, wherein the second material comprises a metal-matrix composite.

20. The assembly of claim 16, wherein the insert comprises a first insert material and a second insert material.

21. The assembly of claim 20, wherein:
the first insert material comprises a metal-matrix composite alloy; and
the second insert material comprises a thermally and electrically conductive grease.

22. The assembly of claim 16, wherein the insert is coupled to the back plate by a fastener.

23. The assembly of claim 22, wherein the fastener is a screw.

24. The assembly of claim 16, wherein:
the back plate comprises a recessed area having a depth; and
the insert positioned in the recessed area, the insert having a height at least equal to the depth of the recessed area.

25. The assembly of claim 24, wherein the insert has a height larger than the depth of the recessed area.

26. The assembly of claim 16, wherein:
the circuit board has a plurality of layers and a contact opening;
the contact opening exposes a portion of a ground plane on one of the layers of the circuit board; and
the insert is electrically coupled to the exposed ground plane.

27. The assembly of claim 26, wherein the ground plane serves as an RF ground.

28. The assembly of claim 16, wherein:
the back plate has a top surface; and
the insert is positioned on the top surface of the back plate such that a portion of the insert protrudes above the top surface.

29. The assembly of claim 16, wherein the thermal expansion coefficient range comprises about 15 ppm/° C.

30. An assembly, comprising:
a back plate having a recessed area with a depth;
an insert positioned in the recessed area, the insert having a height at least equal to the depth of the recessed area, wherein:
the insert comprises a first insert material and a second insert material;
the first insert material comprises a metal-matrix composite; and
the second insert material comprises a thermally and electrically conductive grease; and
a circuit board coupled to the back plate, the circuit board covering at least a portion of the insert.

31. An assembly comprising:
a back plate having a recessed area with a depth;
an insert positioned in the recessed area, the insert having a height at least equal to the depth of the recessed area, the insert is coupled to the recessed area by a fastener; and
a circuit board coupled to the back plate, the circuit board covering at least a portion of the insert.

32. The assembly of claim 31, wherein the fastener is a screw.

33. An assembly comprising:
a back plate having a recessed area with a depth;
an insert positioned in the recessed area, the insert having a height at least equal to the depth of the recessed area; and
a circuit board coupled to the back plate, the circuit board covering at least a portion of the insert, the circuit board has a component opening in a portion of the circuit board which covers the portion of the insert;
the insert includes bumps located on an area of the insert directly under the component opening.

34. An assembly comprising:
a back plate having a top surface;
an insert positioned on the top surface of the back plate such that a portion of the insert protrudes above the top surface; and
a circuit board having a contact opening such that at least a part of the insert is positioned in the contact opening, at least a portion of the circuit board covering at least a portion of the insert, the circuit board has a component opening in the portion of the circuit board covering the portion of the insert;
the insert includes bumps located on an area of the insert directly under the component opening.

35. An assembly comprising:
a back plate having a raised area on a top surface of the back plate; and
a circuit board having a contact opening such that at least a part of the raised area is inserted in the contact opening, the circuit board having a component opening in a portion of the circuit board which covers the part of the raised area;
the raised area includes bumps located directly under the component opening.

* * * * *